(12) United States Patent
Hui et al.

(10) Patent No.: US 7,265,014 B1
(45) Date of Patent: Sep. 4, 2007

(54) AVOIDING FIELD OXIDE GOUGING IN SHALLOW TRENCH ISOLATION (STI) REGIONS

(75) Inventors: Angela T. Hui, Fremont, CA (US); Jusuke Ogura, Cupertino, CA (US); Yider Wu, Campbell, CA (US)

(73) Assignee: Spansion LLC, Sunnyvale, CA (US)

( * ) Notice: Subject to any disclaimer, the term of this patent is extended or adjusted under 35 U.S.C. 154(b) by 279 days.

(21) Appl. No.: 10/799,413

(22) Filed: Mar. 12, 2004

(51) Int. Cl.
*H01L 21/764* (2006.01)
*H01L 29/00* (2006.01)

(52) U.S. Cl. .............. 438/257; 438/296; 257/E21.546

(58) Field of Classification Search ............... 438/257, 438/266, 424, 296; 257/E21.546
See application file for complete search history.

(56) References Cited

U.S. PATENT DOCUMENTS

| | | | |
|---|---|---|---|
| 5,747,377 A | 5/1998 | Wu | 438/444 |
| 6,030,868 A * | 2/2000 | Early et al. | 438/257 |
| 6,033,969 A | 3/2000 | Yoo et al. | 438/425 |
| 6,034,395 A * | 3/2000 | Tripsas et al. | 257/316 |
| 6,043,120 A * | 3/2000 | Early et al. | 438/257 |
| 6,051,451 A * | 4/2000 | He et al. | 438/142 |
| 6,074,927 A | 6/2000 | Kepler et al. | 438/400 |
| 6,110,779 A * | 8/2000 | Yang et al. | 438/257 |
| 6,146,975 A | 11/2000 | Kuehne et al. | 438/437 |
| 6,197,637 B1 * | 3/2001 | Hsu et al. | 438/257 |
| 6,218,265 B1 | 4/2001 | Colpani | 438/424 |
| 6,309,926 B1 * | 10/2001 | Bell et al. | 438/257 |
| 6,410,405 B2 | 6/2002 | Park | 438/431 |
| 6,468,853 B1 | 10/2002 | Balasubramanian et al. | 438/221 |
| 6,509,232 B1 * | 1/2003 | Kim et al. | 438/264 |
| 6,548,374 B2 | 4/2003 | Chung | 438/424 |
| 6,613,649 B2 | 9/2003 | Lim et al. | 438/435 |

OTHER PUBLICATIONS

S. Wolf, Silicon Processing for the VLSI Era, Lattice Press, vol. 2, 1990, pp. 45-47.*

* cited by examiner

*Primary Examiner*—Anh Duy Mai
(74) *Attorney, Agent, or Firm*—Winstead PC

(57) ABSTRACT

A method and device for avoiding oxide gouging in shallow trench isolation (STI) regions of a semiconductor device. A trench may be etched in an STI region and filled with insulating material. An anti-reflective coating (ARC) layer may be deposited over the STI region and extend beyond the boundaries of the STI region. A portion of the ARC layer may be etched leaving a remaining portion of the ARC layer over the STI region and extending beyond the boundaries of the STI region. A protective cap may be deposited to cover the remaining portion of the ARC layer as well as the insulating material. The protective cap may be etched back to expose the ARC layer. However, the protective cap still covers and protects the insulating material. By providing a protective cap that covers the insulating material, gouging of the insulating material in STI regions may be avoided.

9 Claims, 3 Drawing Sheets

AVOIDING FIELD OXIDE GOUGING IN SHALLOW TRENCH ISOLATION (STI) REGIONS

TECHNICAL FIELD

The present invention is related to the use of shallow trench isolation (STI) in the design and fabrication of integrated circuits, and, more specifically, avoiding damage to the field oxide in STI regions during subsequent processing steps in the fabrication of an integrated circuit device.

BACKGROUND INFORMATION

In the design and fabrication of integrated circuits, it is necessary to isolate adjacent active devices from one another so that leakage currents between devices do not cause the integrated circuits to fail or malfunction. As dimensions of semiconductor devices have shrunk, shallow trench isolation (STI) techniques have largely replaced other isolation techniques such as LOCOS. In fabricating an STI region, conventional photolithography and etching techniques may be used to create trenches in the integrated circuit substrate. The trenches may then be filled with one or more insulating materials, such as thermal silicon oxide. The wafer may then be planarized using chemical-mechanical polishing (CMP). Additional processing steps form the active devices on the substrate which are interconnected to create the circuitry in the integrated circuit.

As stated above, conventional photolithography techniques may be used to create trenches in the integrated circuit substrate. In photolithography, light may be used to expose a photolithography mask overlying the trench where the light may be reflected off of the integrated circuit layers underneath the mask. The reflections may have detrimental effects on the quality and accuracy of the resulting mask. To improve the results of photolithography at these small scales, SiN (SiON, SiRN) may be used as an anti-reflective coating or hard mask layer. The anti-reflective coating layer may reduce or substantially eliminate these reflections thereby resulting in improved masks for creating small features and structures in an integrated device.

After the formation of the gate, the hard mask/anti-reflective coating layer may need to be removed prior to subsequent device processing. The hard mask/anti-reflective coating layer may be removed using either a conventional wet strip process or a conventional plasma etching process. A conventional wet strip process may use hot phosphoric acid which may damage the polysilicon layer underlying the anti-reflective coating layer; whereas, a conventional plasma etching process may cause extensive gouging in any exposed field oxide, including in the thermal oxide in an STI region. Gouges in STI regions may alter the isolation properties of the STI region. Further, gouges in STI regions may create an uneven surface causing gap-fill problems for subsequent processing of the device wafer.

Therefore, there is a need in the art to strip a hard mask/anti-reflective coating layer that avoids damage to exposed polysilicon surfaces as well as avoids gouging exposed field oxide such as in STI regions.

SUMMARY OF INVENTION

The problems outlined above may at least in part be solved by depositing a protective cap or plug over the hard mask/anti-reflective coating layer. The protective cap may be etched back to expose the hard mask/anti-reflective coating layer. However, the protective cap still covers and protects the thermal oxide in the trench. By providing a protective cap that covers the thermal oxide in the trench, gouging of the exposed field oxide in STI regions may be avoided.

In one embodiment of the present invention, a method for avoiding oxide gouging in shallow trench isolation (STI) regions of a semiconductor device may comprise the step of etching a trench in an STI region. The method may further comprise depositing insulating material in the formed trench. The method may further comprise depositing an anti-reflective coating layer overlying the STI region and extending beyond the boundaries of the STI region. The method may further comprise etching a portion of the anti-reflective coating layer over the STI region leaving a remaining portion of the anti-reflective coating layer over the STI region and extending beyond the boundaries of the STI region. The method may further comprise depositing a protective cap covering the STI region and extending beyond the boundaries of the STI region. The deposited protective cap covers the remaining portion of the anti-reflective coating layer as well as the insulating material in the trench.

In another embodiment of the present invention, a device may comprise a trench in a shallow trench isolation (STI) region. The device may further comprise insulating material filled in the trench. The device may further comprise a gate oxide layer covering a portion of the STI region and extending beyond the boundaries of the STI region. The device may further comprise a polysilicon layer overlying the gate oxide layer where the polysilicon layer covers the portion of the STI region and extends beyond the boundaries of the STI region. The device may further comprise an anti-reflective coating layer overlying the polysilicon layer where the anti-reflective coating layer covers the portion of the STI region and extends beyond the boundaries of the STI region. The device may further comprise a protective cap overlying the anti-reflective coating layer where the protective cap covers the entire STI region and extends beyond the boundaries of the STI region. Specifically, the protective cap covers the anti-reflective coating layer covering the portion of the STI region and covers the insulating material filled in the trench over the STI region.

The foregoing has outlined rather broadly the features and technical advantages of one or more embodiments of the present invention in order that the detailed description of the present invention that follows may be better understood. Additional features and advantages of the present invention will be described hereinafter which form the subject of the claims of the invention.

BRIEF DESCRIPTION OF DRAWINGS

A better understanding of the present invention can be obtained when the following detailed description is considered in conjunction with the following drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known processes have been shown in block diagram form in order not to obscure the present invention in unnecessary detail. For the most part, some details and considerations have been omitted inasmuch as such details and considerations are not necessary to obtain a complete understanding of the present invention and are within the skills of persons of ordinary skill in the relevant art.

Figure 1:
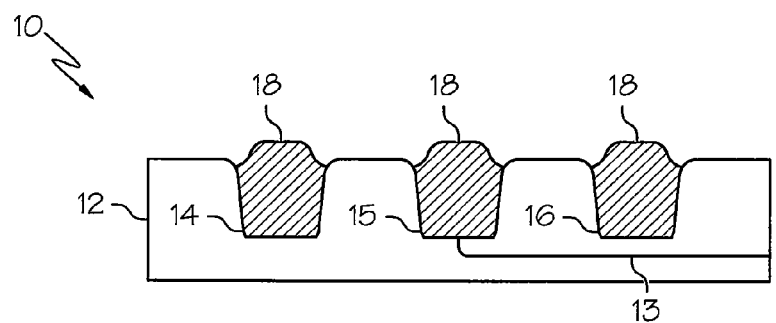
FIG. 1 illustrates an embodiment of the present invention of a partial cross-section of a semiconductor wafer including a number of shallow trench isolation structures.

FIG. 1 illustrates an embodiment of the present invention of a cross-section of a portion of a wafer 10 comprising shallow trench isolation (STI) structures 14-16. Wafer 10 may include a substrate 12. Substrate 12 may be made of doped silicon, although gallium arsinide or other suitable semiconductor substrate material may also be used. Using conventional well-known techniques and processes, substrate 12 may include a well 13, which may be a p-well or an n-well depending on the structure being fabricated and the process technology being used, e.g. CMOS, MOS, BiCMOS, or bipolar process technologies. As illustrated in FIG. 1, the isolation structures may be formed in an area of a single dopant type or concentration, or at a boundary between areas that have been doped differently. For instance, trench 14 is formed directly in substrate 12; whereas, trench 16 is formed in doped well 13 and trench 15 is formed at the boundary between substrate 12 and well 13.

Figure 2:
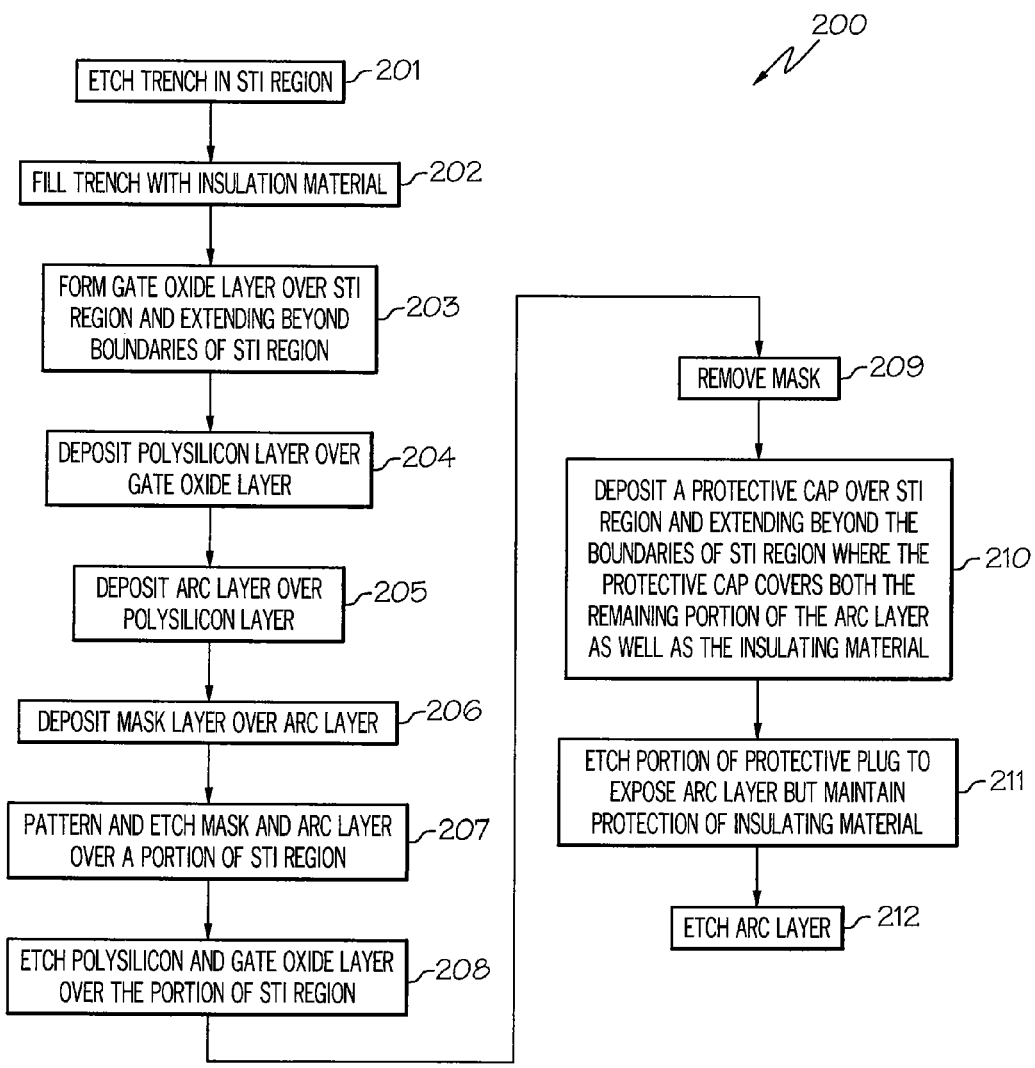
FIG. 2 illustrates a flowchart of a method for avoiding field oxide gouging in shallow trench isolation (STI) regions of a semiconductor device in accordance with the present invention.

As stated in the Background Information section, in the fabrication of a semiconductor device using STI techniques, the hard mask/anti-reflective coating layer may need to be removed prior to subsequent device processing. The hard mask/anti-reflective coating layer may be removed using either a conventional wet strip process or a conventional plasma etching process. A conventional wet strip process may use hot phosphoric acid which may damage the polysilicon layer underlying the anti-reflective coating layer; whereas, a conventional plasma etching process may cause extensive gouging in any exposed field oxide, including in the thermal oxide in an STI region. Gouges in STI regions may alter the isolation properties of the STI region. Further, gouges in STI regions may create an uneven surface causing gap-fill problems for subsequent processing of the device wafer. Therefore, there is a need in the art to strip a hard mask/anti-reflective coating layer that avoids damage to exposed polysilicon surfaces and avoids gauging exposed field oxide such as in STI regions. The hard mask/anti-reflective coating layer may be stripped while avoiding gouging the exposed field oxide in the STI regions using the method described below in association with FIGS. 2 and 3A-F. FIG. 2 is a flowchart of a method for avoiding field oxide gouging in shallow trench isolation (STI) regions of a semiconductor device in accordance with an embodiment of the present invention. FIGS. 3A-F illustrate an embodiment of the present invention of the various stages in the fabrication of an integrated circuit in an STI region of a wafer using the method described in FIG. 2. FIGS. 2 and 3A-F will be discussed in conjunction with one another.

Figure 3A:
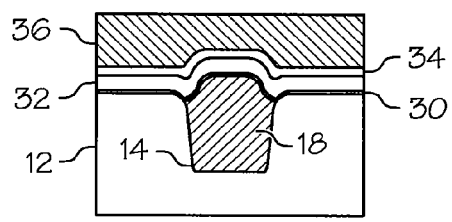
FIGS. 3A through 3G illustrate various stages in the fabrication of an integrated circuit in an STI region of a wafer in accordance with an embodiment of the present invention.

Referring to FIG. 2, in conjunction with FIGS. 3A-F, in step 201, a trench, e.g., trench 14, is etched in an STI region in a wafer 10 (FIG. 1) as illustrated in FIG. 3A. In step 202, the formed trench, e.g., trench 14, is filled with an insulating material 18, e.g., thermal oxide, as illustrated in FIG. 3A.

In step 203, a gate oxide layer 30 is formed over the STI region, e.g., STI region 14, and extends beyond the boundaries of the STI region, e.g., STI region 14, as illustrated in FIG. 3A. In step 204, a polysilicon layer 32 is deposited over gate oxide layer 30 as illustrated in FIG. 3A. In step 205, an anti-reflective coating layer 34 is deposited over polysilicon layer 32 as illustrated in FIG. 3A. In step 206, a mask layer 36 is deposited over anti-reflective coating layer 34 as illustrated in FIG. 3A.

Figure 3B:
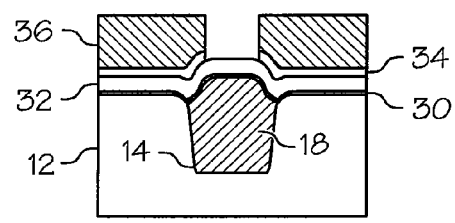

In step 207, mask layer 36 and anti-reflective coating layer 34 are patterned and etched over a portion of the STI region, e.g., STI region 14, to expose selected portions of polysilicon layer 32 as illustrated in FIG. 3B.

Figure 3C:
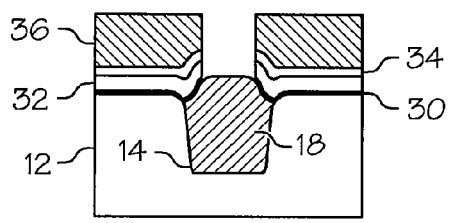

In step 208, polysilicon layer 32 and gate oxide layer 30 are etched over the same portion of the STI region, e.g., STI region 14, to form interconnects on wafer 10 as illustrated in FIG. 3C.

Figure 3D:
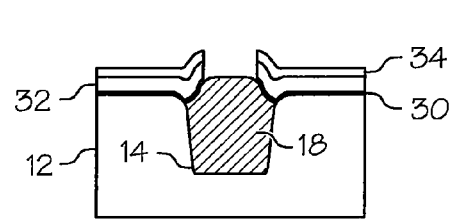

In step 209, mask 36 is removed from wafer 10 as illustrated in FIG. 3D.

Figure 3E:
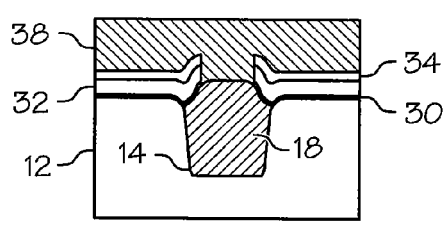

The remaining ARC layer 34 over the STI region and extending beyond the boundaries of the STI region, e.g., STI region 14, needs to be stripped. As stated above, anti-reflective coating layer 34 needs to be stripped in such a manner as to avoid field oxide gouging. Gouging of the field oxide may be avoided by depositing a protective cap or plug 38, e.g., thin layer of photoresist, in step 210, over the STI region, e.g., STI region 14, and extending beyond the boundaries of the STI region, e.g., STI region 14, as illustrated in FIG. 3E. In this manner, the remaining portion of anti-reflective coating layer 34 as well as insulating material 18 is covered by protective cap 38 as illustrated in FIG. 3E.

Figure 3F:
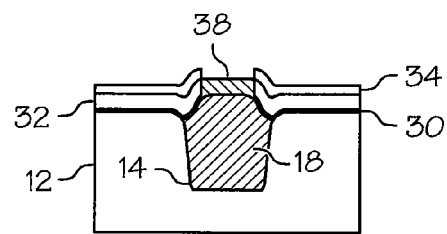

In step 211, protective cap 38 is etched back to expose anti-reflective coating layer 34 but maintains protection of insulating material 18 as illustrated in FIG. 3F. That is, protective cap 38 is etched back to expose anti-reflective coating layer 34 but remains covering insulating material 18 to protect insulating material 18 from etching. In one embodiment, protective cap 38 is a photoresist that is relatively resistant to the types of etching used to remove anti-reflective coating layer 34 from wafer 10. For example, protective cap 38 may be a layer of photoresist with a thickness of about 800 to 1200 Å (Angstroms). In one embodiment, protective cap 38 may be a layer of photoresist with a thickness of about 1000 Å.

Figure 3G:
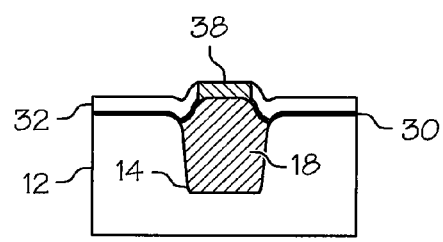

In step 212, anti-reflective coating layer 34 is etched using plasma etching while avoiding gouging of insulating material 18 due to protective cap 38 covering insulating material 18 as illustrated in FIG. 3G. It is noted that other etching techniques besides plasma etching may be used to remove anti-reflective coating layer 34 that is highly selective for removing anti-reflective coating layer 34 and not reactive with the material of protective cap 38. For example, a plasma etching process using CF4, CHF3 and CH3F as the active species may be sufficiently selective to remove anti-reflective coating layer 34 without removing the photoresist used as protective cap 38.

It is further noted that method 200 may include other and/or additional steps that, for clarity, are not depicted. It is further noted that method 200 may be executed in a different order than presented and that the order presented in the discussion of FIG. 2 is illustrative. It is further noted that certain steps in method 200 may be executed in a substantially simultaneous manner.

The present invention has been described with reference to various embodiments, which are provide for purposes of illustration, so as to enable one of ordinary skill in the art to make and use the invention and is provided in the context of a patent application and its requirements. One of ordinary skill in the art will readily recognize that various modifications to the embodiment may be made with out departing from the generic principles and features described herein. Accordingly, the present invention is not intended to be limited to the disclosed embodiment but is to be accorded the widest scope consistent with the principles and features described herein subject to the appended claims.

What is claimed is:

1. A method for avoiding oxide gouging in shallow trench isolation (STI) regions of a semiconductor device comprising the steps of:
    etching a trench in an STI region;
    filling said trench with an insulating material;
    depositing an anti-reflective coating layer over said STI region and extending beyond the boundaries of said STI region;
    etching a portion of said anti-reflective coating layer over said STI region leaving a remaining portion of said anti-reflective coating layer over said STI region and extending beyond the boundaries of said STI region; and
    depositing a protective cap covering said STI region and extending beyond the boundaries of said STI region, wherein said protective cap covers said remaining portion of said anti-reflective coating layer and said insulating material over said STI region;
    wherein said protective cap comprises photoresist material.

2. The method as recited in claim 1, wherein said photoresist material has a thickness of about 800 Å to 1200 Å.

3. A method for avoiding oxide gouging in shallow trench isolation (STI) regions of a semiconductor device comprising the steps of:
    etching a trench in an STI region;
    filling said trench with an insulating material;
    depositing an anti-reflective coating layer over said STI region and extending beyond the boundaries of said STI region;
    etching a portion of said anti-reflective coating layer over said STI region leaving a remaining portion of said anti-reflective coating layer over said STI region and extending beyond the boundaries of said STI region;
    depositing a protective cap covering said STI region and extending beyond the boundaries of said STI region, wherein said protective cap covers said remaining portion of said anti-reflective coating layer and said insulating material over said STI region;
    etching a portion of said protective cap to expose said remaining portion of said anti-reflective coating layer while maintaining protection of said insulating material; and
    etching said remaining portion of said anti-reflective coating layer;
    wherein said insulating material is protected during etching of said remaining portion of said anti-reflective coating layer by said protective cap.

4. The method as recited in claim 3, wherein said remaining portion of said anti-reflective coating layer is etched using a plasma etch process.

5. A method for avoiding oxide gouging in shallow trench isolation (STI) regions of a semiconductor device comprising the steps of:
    etching a trench in an STI region;
    filling said trench with an insulating material;
    forming a gate oxide layer overlying said STI region and extending beyond the boundaries of said STI region;
    depositing a polysilicon layer over said gate oxide layer;
    depositing an anti-reflective coating layer over said polysilicon layer;
    etching a portion of said anti-reflective coating layer over said STI region leaving a remaining portion of said anti-reflective coating layer over said STI region and extending beyond the boundaries of said STI region;
    etching an exposed portion of said polysilicon layer and said gate oxide layer over said STI region leaving a remaining portion of said polysilicon layer and said gate oxide layer over said STI region and extending beyond the boundaries of said STI region;
    depositing a protective cap over said STI region and extending beyond the boundaries of said STI region, wherein said protective cap covers said remaining portion of said anti-reflective coating layer over said STI region and covers said insulating material over said STI region;
    etching a portion of said protective cap to expose said remaining portion of said anti-reflective coating layer while maintaining protection of said insulating material; and
    etching said remaining portion of said anti-reflective coating layer;
    wherein said insulating material is protected during etching of said remaining portion of said anti-reflective coating layer by said protective cap.

6. The method as recited in claim 1, wherein said protective cap comprises photoresist material.

7. The method as recited in claim 6, wherein said photoresist material has a thickness of about 800 Å to 1200 Å.

8. The method as recited in claim 1, wherein said remaining portion of said anti-reflective coating layer is etched using a plasma etch process.

9. The method as recited in claim 1, wherein said insulating material comprises thermal oxide.

* * * * *